(12) United States Patent
Mouttet (10) Patent No.: US 7,425,715 B2
(45) Date of Patent: Sep. 16, 2008

(54) DIGITAL PARALLEL ELECTRON BEAM LITHOGRAPHY STAMP

(76) Inventor: Blaise Laurent Mouttet, 6380 Michael Robert Dr., Springfield, VA (US) 22150

( * ) Notice: Subject to any disclaimer, the term of this patent is extended or adjusted under 35 U.S.C. 154(b) by 307 days.

(21) Appl. No.: 11/418,057

(22) Filed: May 5, 2006

(65) Prior Publication Data
US 2007/0257212 A1 Nov. 8, 2007

(51) Int. Cl.
*G21K 5/00* (2006.01)
(52) U.S. Cl. ............... 250/492.22; 250/492.1; 250/492.2; 250/492.23; 250/492.3
(58) Field of Classification Search ......... 250/492.1, 250/492.2, 492.22, 492.23, 492.3; 977/949, 977/712, 720, 939
See application file for complete search history.

(56) References Cited

U.S. PATENT DOCUMENTS

| | | | |
|---|---|---|---|
| 4,896,044 A | | 1/1990 | Li et al. |
| 4,968,390 A | | 11/1990 | Bard et al. |
| 5,047,649 A | | 9/1991 | Hodgson et al. |
| 5,412,641 A | | 5/1995 | Shinjo et al. |
| 5,973,444 A | * | 10/1999 | Xu et al. ............... 313/309 |
| 6,283,812 B1 | | 9/2001 | Jin et al. |
| 6,504,292 B1 | * | 1/2003 | Choi et al. ............ 313/310 |
| 6,538,367 B1 | * | 3/2003 | Choi et al. ............ 313/309 |
| 6,660,959 B2 | * | 12/2003 | Vallance et al. ........ 219/121.18 |
| 6,864,162 B2 | * | 3/2005 | Jin ..................... 438/551 |
| 6,885,010 B1 | * | 4/2005 | Traynor et al. ......... 250/427 |
| 6,899,854 B2 | | 5/2005 | Darty |
| 6,917,043 B2 | * | 7/2005 | Thomas et al. ......... 250/398 |
| 6,962,515 B2 | | 11/2005 | Dean et al. |
| 6,982,519 B2 | * | 1/2006 | Guillorn et al. ........ 313/311 |
| 7,011,927 B2 | | 3/2006 | Iwamatsu |
| 7,012,266 B2 | | 3/2006 | Jin |
| 2002/0182542 A1 | * | 12/2002 | Choi et al. ............ 430/296 |
| 2003/0102444 A1 | | 6/2003 | Deppert et al. |
| 2003/0209676 A1 | * | 11/2003 | Loschner et al. ....... 250/492.2 |
| 2004/0036398 A1 | * | 2/2004 | Jin .................... 313/309 |
| 2004/0140432 A1 | * | 7/2004 | Maldonado et al. ..... 250/423 P |
| 2006/0118735 A1 | * | 6/2006 | Kim et al. ............. 250/492.2 |
| 2007/0279334 A1 | * | 12/2007 | Mouttet ................ 345/76 |

OTHER PUBLICATIONS

Mesquida et al., Maskless nanofabrication using the electrostatic attachment of gold particles to electrically patterned surfaces, Microelectronics Engineering, 2002, 671-674.
Lim et al., Electrostatically Driven Dip-Pen Nanolithography of Conducting Polymers, Advanced Materials, Adv. Materials, 2002, 1474-1477.

(Continued)

*Primary Examiner*—Jack I. Berman
*Assistant Examiner*—Michael Maskell (57) ABSTRACT

An array of vertically aligned electron emitting nanotips such as multiwall carbon nanotubes are formed for use as a lithographic stamp. Crosswire addressing is used to generate electron emission from particular nanotips within the array. The nanotip array may be used to cure a resist, produce localized electrochemical reactions, establish localized electrostatic charge distributions, or perform other desirable coating or etching process steps so as to create nanoelectronic circuitry or to facilitate molecular or nanoscale processing.

18 Claims, 12 Drawing Sheets

OTHER PUBLICATIONS

Suh et al., Study of the field-screening effect of highly ordered carbon nanotube arrays, Applied Physics Letters, 2002, 2392-2394.

Jeong et al., Fabrication of the aligned and patterned carbon nanotube field emitters using the anodic aluminum oxide nano-template on a Si wafer, Synthetic Metals, 2003, 385-390.

Kim et al., Growth of carbon nanotubes with anodic aluminum oxide formed on the catalytic metal-coated Si substrate, Diamond and Related Materials, 2003, 870-873.

Akita et al., Length Adjustment of Carbon Nanotube Probe by Electron Bombardment, Jpn. J. Appl. Phys., 2002, 4887-4889.

* cited by examiner

DIGITAL PARALLEL ELECTRON BEAM LITHOGRAPHY STAMP

CROSS-REFERENCE TO RELATED APPLICATIONS

This application is related to the following co-pending patent application, which is incorporated by reference in its entirety: U.S. application Ser. No. 11/395,238, entitled "Parallel Electron Beam Lithography Stamp (PEBLS)," filed Apr. 3, 2006.

FIELD OF THE INVENTION

The present invention pertains to a tool and method used to form nanostructures or nano-structural features and is applicable to the fields of electronic device fabrication, material processing, chemical processing, and biological processing at nanometer dimensions.

BACKGROUND OF THE INVENTION

Small scale fabrication has been dominated over the past 40 years by lithography techniques that employ radiation in the form or visible or ultraviolet light. However, these techniques are limited by the wavelengths of the light used and fabrication below 100 nm is problematic. Electron and ion beam lithography are alternative techniques capable of providing finer resolution but which typically use a serial scanning process that limits the speed of production. In addition, the use of masks for optical lithography and the required low pressure environmental control for e-beam lithography induces a high cost to modem fabrication processes.

Other techniques that have received attention because of their ability to fabricate structures with nanometer resolutions are nanoimprint lithography and scanning probe lithography. These techniques are distinguishable from the typical optical and electron based lithography discussed above in that these tools are proximal in nature and either contact, or are separated by a nanoscopic gap from, the substrate undergoing processing. Because the processing occurs at a proximal distance dispersion problems are reduced or eliminated, which enhances the maximum possible resolution.

Nanoimprint lithography employs a molded stamp structure with grooves formed therein so as to emboss, coat, or otherwise imprint a pattern on a target substrate. However, in repeated use, the stamp structure of the mold may be subject to erosion or soiling over time that can negatively impact the achievable resolution so that nanometer resolution patterning becomes impossible or inconsistent and high volume mass production becomes problematic.

Scanning probe lithography techniques employ devices with ultrafine tips to etch, coat, or otherwise treat a substrate so as to generate nanometer resolution patterns. However, scanning probe lithography is also a serial process and is therefore too time consuming to be employed in large scale fabrication.

Chapter 9 of *Nanoelectronics and Information Technology* (Ed. Rainer Waser, WILEY-VCH, 2003, pgs. 223-247) provides further background details of modem lithography approaches.

Within the past few years various approaches have been taken toward the use of large arrays of tips capable of field induced electron emission to accomplish lithographic procedures. Included in this group is the development of Massively Parallel Digital Electrostatic E-beam Array Lithography (DEAL) by Oak Ridge National Laboratory, a parallel electron beam machining tool and method as disclosed in U.S. Pat. No. 6,660,959, and a MEMS controlled parallel e-beam nanolithography tool as disclosed in U.S. Pat. No. 7,012,266. However, in order to control individual electron emitting tips in a large density array, wiring traditionally becomes a limiting factor and an effective parallel e-beam nanofabrication tool useful in mass production of a wide array of nanostructures, materials, or chemicals has yet to be developed.

SUMMARY OF INVENTION

The present invention provides a Parallel Electron Beam Lithography Stamp (PEBLS) that includes controls and wiring allowing for a high degree of addressability in high density arrays of emission tips. Improved environmental control may be maintained during lithography performed by the PEBLS by forming the emission tips within a cell of a substrate in which a periphery of the cell contacts a target to be processed.

A microfluidic supply system and alignment sensor system among other optional features are taught to complement the functionality of the PEBLS. Several embodiments are taught including using the PEBLS tool in curing a resist, performing localized electrochemical reactions with the PEBLS tool, establishing predetermined electrostatic charge distributions with the PEBLS tool, and coating or etching process steps using the PEBLS tool.

DETAILED DESCRIPTION OF THE INVENTION

I. Manufacturing of Digital PEBLS

FIG. 1a-1d illustrate the side view of one embodiment for manufacturing the Parallel Electron Beam Lithography Stamp (PEBLS). FIG. 2a-2d illustrate the top view of this embodiment for manufacturing the PEBLS.

Figure 1A:
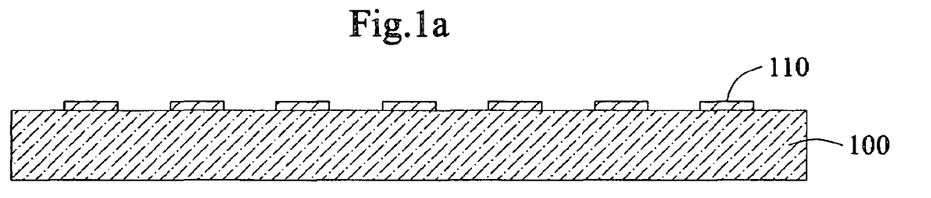
FIG. 1a-1d illustrate the side view of one embodiment for manufacturing the Parallel Electron Beam Lithography Stamp (PEBLS).
Figure 2A:
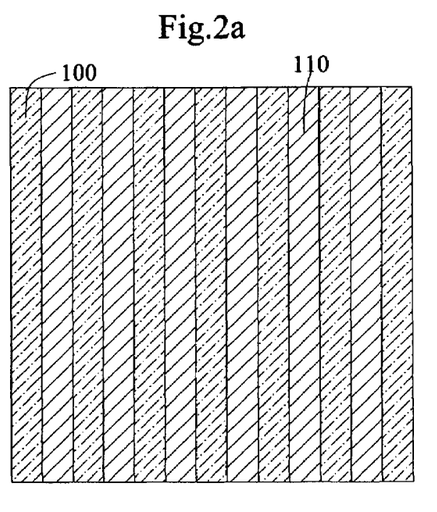
FIG. 2a-2d illustrate the top view of this embodiment for manufacturing the PEBLS.

In FIGS. 1a and 2a, an insulated substrate 100 is provided upon which a first wiring pattern including parallel conductive wires 110 is formed using either conventional optical lithographic approaches or, for finer resolution patterning, using e-beam lithography, nanoimprint lithography, dip pen nanolithography, etc. The material of the wiring pattern includes catalytic material such as metallic nanoparticles of Fe, Ni, Co, or Mo.

Figure 1B:
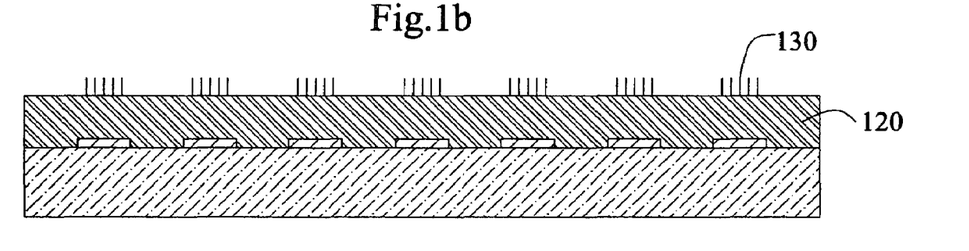
Figure 2B:
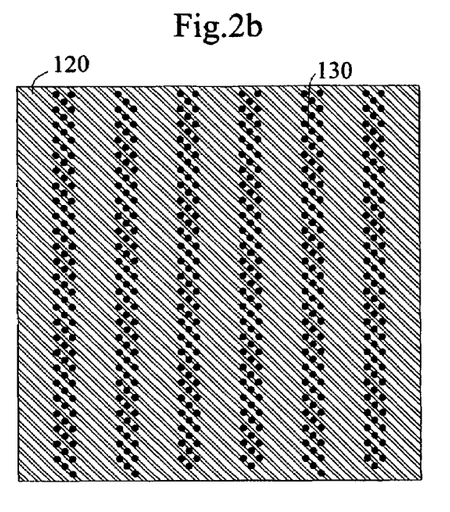

In FIGS. 1b and 2b, an anodic aluminum oxide (AAO) template 120 is formed on the substrate 100 with the wiring pattern using known techniques such as disclosed by the articles of Kim et al. "Growth of carbon nanotubes with anodic aluminum oxide formed on the catalytic metal-coated Si substrate" (Diamond and Related Materials 12, 2003, 870-873) or Jeong et al. "Fabrication of the aligned and patterned carbon nanotube field emitters using the anodic aluminum oxide nano-template on a Si wafer" (Synthetic Metals 139, 2003, 385-390). AAO templates typically include vertically aligned nanopores and are formed with a thickness on the order of several microns with diameters and interpore spacing of the nanopores in the nanometer range. Nanotips 130 such as carbon nanotubes or nanofibers may be formed from the catalytic material included in the wiring pattern 110 extending from the AAO template using CVD techniques.

Figure 1C:
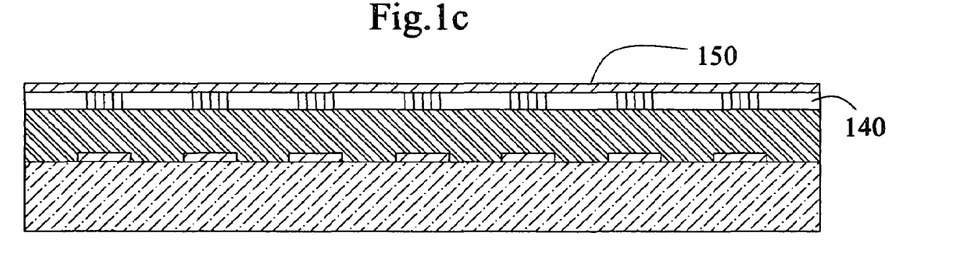
Figure 2C:
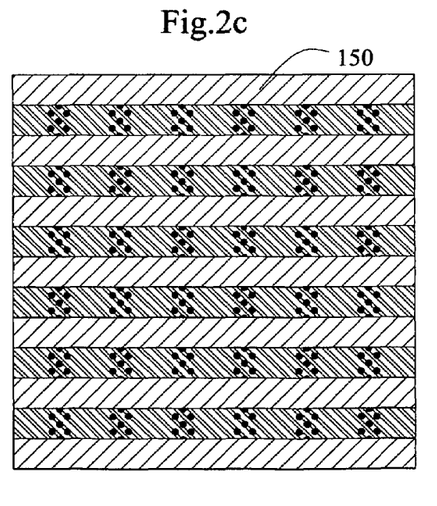

In FIGS. 1c and 2c, a first thin film insulation layer 140, such as a polymer film or an oxide ($SiO_2$, $TiO_2$), may be formed above the AAO template by an appropriate deposition technique (spin coating, dip coating, PVD, CVD, etc.) followed by an etch planarization of the film 140 so as to expose nanotips 130 to a desired length using appropriate chemical, mechanical, laser, or other technique. Additional etching or other techniques may be used to selectively shorten, or render non-conductive, parallel arrays of the nanotips in a direction perpendicular to the direction of arrangement of the conductive wires 110. Examples of techniques which may be employed are found in Jin et al. U.S. Pat. No. 6,283,812, Dean et al. U.S. Pat. No. 6,962,515,and the article "Length Adjustment of Carbon Nanotube Probe by Electron Bombardment" by Akita et al. (Jpn. J. Appl. Phys., vol. 41, 2002, 4887-4889). A second wiring pattern including parallel conductive wires 150 is deposited above the area in which the nanotips have been shortened or rendered nonconductive using one of the various lithographic patterning techniques known to one of ordinary skill in the art. Conceivably the shortening or rendering nonconductive of the nanotips and formation of the second wiring pattern may be performed in a common process.

Figure 1D:
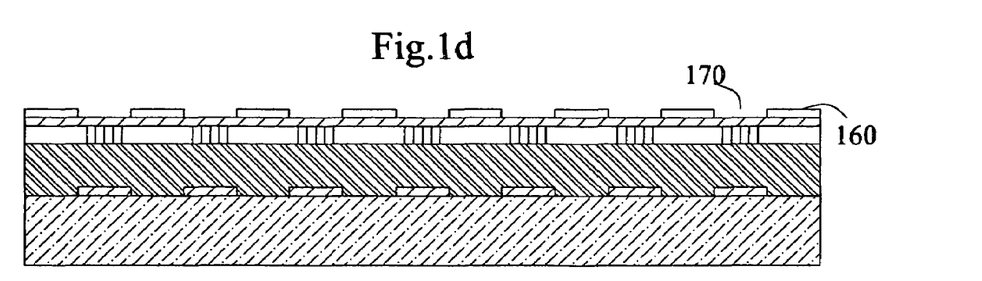
Figure 2D:
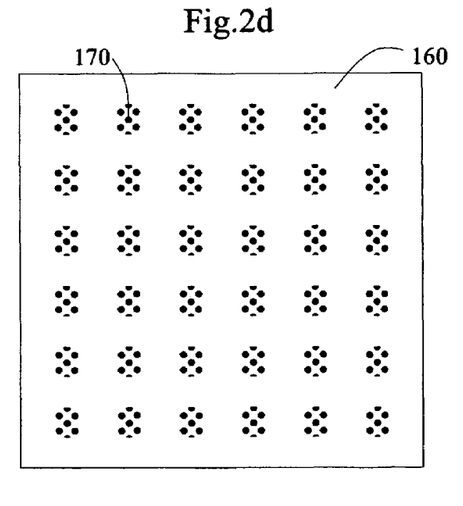

In FIGS. 1d and 2d, a second thin film insulation layer 160 is formed over the surface containing the second wiring pattern and is planarized to a particular thickness. The second insulation layer may be thinned to a degree that electron field emission from the remaining nanotips, which were not shortened or rendered nonconductive previously, may be used to etch away the insulation above these nanotips thus forming electron emission regions 170 between adjacent conducting wires 150.

Alternatively, an external selective etch may be performed to remove the insulation above the remaining unshortened nanotips and expose the nanotips.

Selective electron emission from a particular electron emission region 170 may be generated by providing a negative or ground potential to a particular wire of the first conductive wires 110 while providing a sufficient positive potential to two adjacent wires of the second conductive wires 120. Electron emission from all of the emission regions 170 may be accomplished by setting all of the first conductive wires 110 to a negative or ground voltage and all of the second conductive wires 150 to a positive voltage. An external positively biased (i.e. anodic) electrode may be provided when etching the second insulation layer by the nanotips to form the electron emission regions 170.

Assuming that the distance between the wires of the first and second conducting patterns equals the wire width, the electron emission regions may account for up to 25% of the surface area of the PEBLS shown in FIG. 2d. The area of each of the electron emission regions 170 is preferably in the range from 0.01-1 $\mu M^2$ containing 1-100 nanotips. Forming small electron emission regions with a smaller number of nanotips per emission region would provide the advantage higher resolutions, however larger electron emission regions with a larger number of nanotips per emission region would provide the advantage of redundancy in case of individual nanotip failure. Suh et al. "Study of the field-screening effect of highly ordered carbon nanotube arrays" (Applied Physics Letters, Volume 80, No. 13, 2002, 2392-2394) discusses optimizing field emission for high density nanotube arrays.

The effective area of coverage of a target to be processed by a particular electron emission region will depend upon the distance between the nanotips and the target as well as the type of processing being performed by the electrons (curing, etching, electrostatic imaging, etc.) and may be assumed to be greater than the area of the emission region due to space charge spreading and electrostatic buildup on the opposing target. However, if the effective area is less than that necessary for complete coverage of a target, either a positioning mechanism may be provided to reposition the target relative to the digital PEBLS or electron steering may be provided as described in section III.

Figure 3:
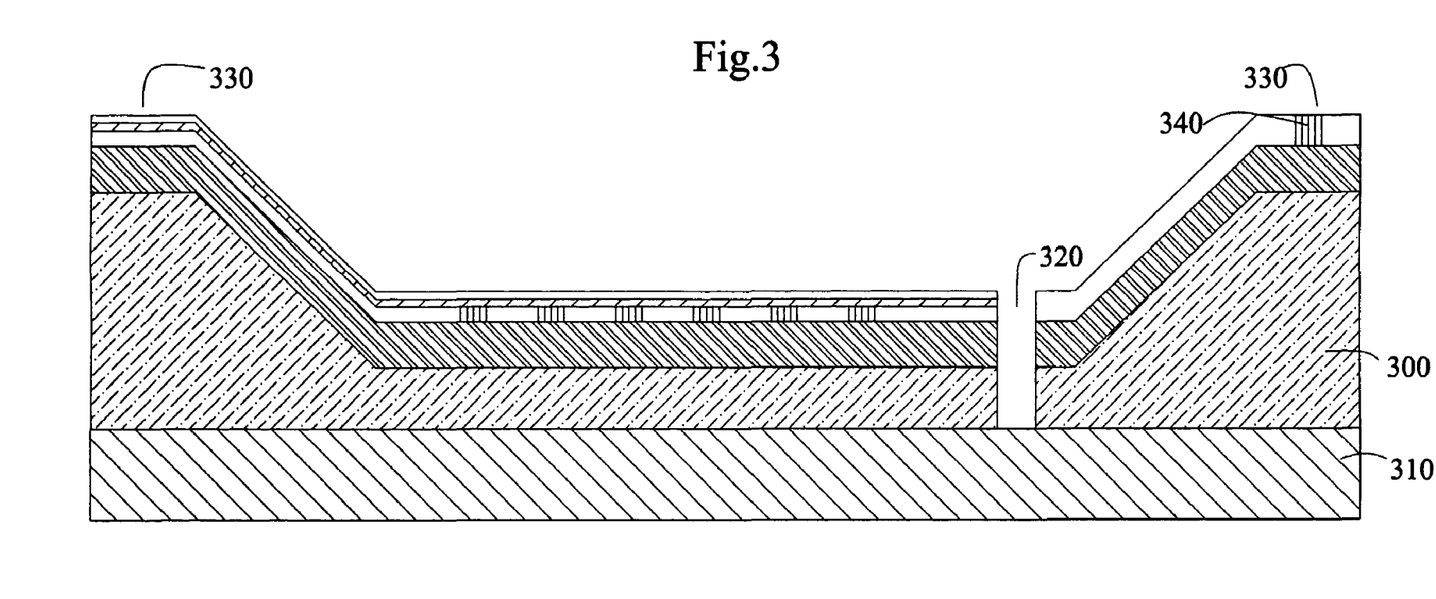
FIG. 3 illustrates an embodiment of the PEBLS formed within an anisotropic etched substrate.

FIG. 3 illustrates an embodiment of the PEBLS formed within an anisotropic etched substrate 300 and attached to a microfluidic flow control substrate 310 providing a source of gaseous, vapor, or liquid material to assist in the lithographic processing via a channel 320 formed through the substrate 300. Alignment nanotips 340 are formed within a contact surface 330 of the PEBLS so as to detect proper positioning of the PEBLS with respect to a target substrate that is to undergo lithographic processing. Upon contact with the target substrate the PEBLS and target forms an enclosed space or cell. Further details of these components of the invention may be found in the co-pending patent application Ser. No. 11/395238, entitled "Parallel Electron Beam Lithography Stamp (PEBLS)," filed Apr. 3, 2006.

Figure 4A:
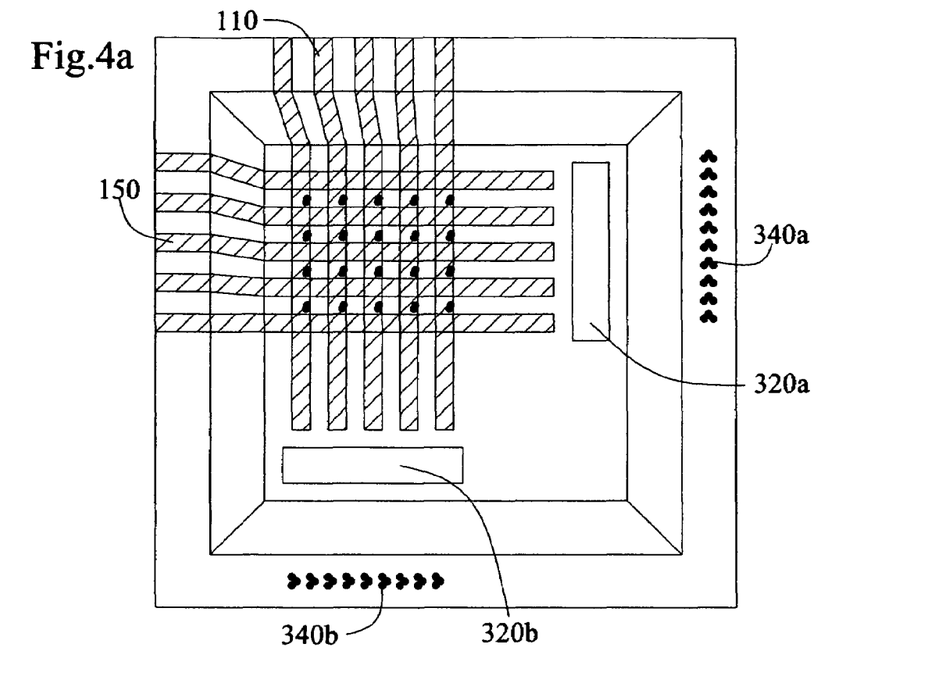
FIG. 4a and 4b illustrate top views of embodiments of the PEBLS formed as in FIG. 3.
Figure 4B:
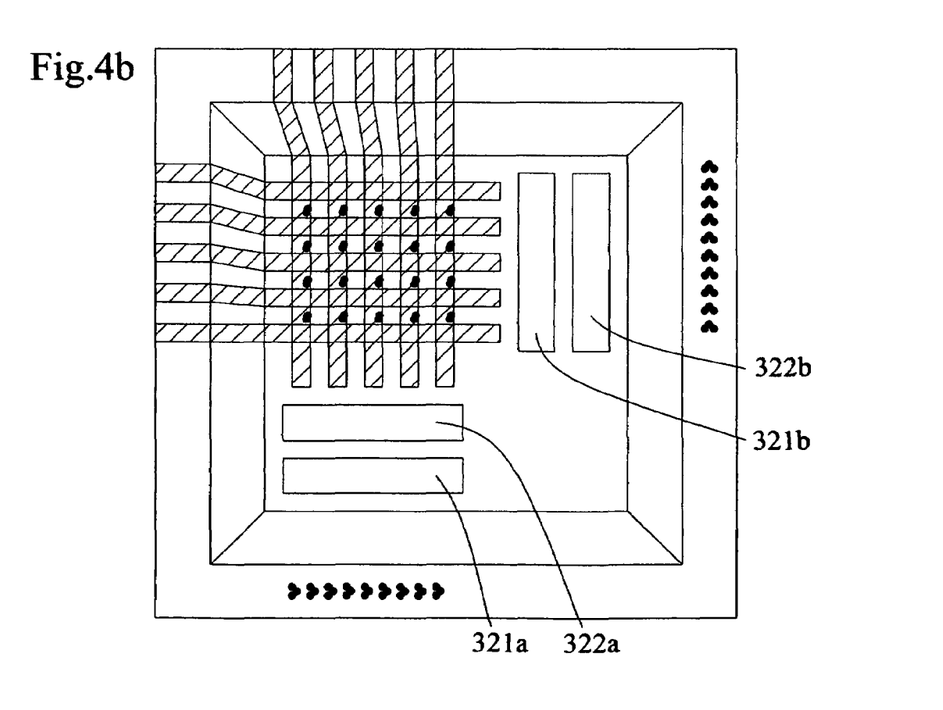

FIGS. 4a and 4b illustrate top views of embodiments of the PEBLS formed as in FIG. 3. In FIG. 4a, both vertical axis and horizontal axis alignment nanotips 340a and 340b are shown. Both an input fluid channel 320a and an output fluid channel 320b are provided. In FIG. 4b, both $1^{st}$ fluid input/output channels 321a,321b and $2^{nd}$ fluid input/output channels 322a, 322b are provided to provide for the independent supply of different fluids to the PEBLS if desirable.

II. Control of Digital PEBLS

Figure 5A:
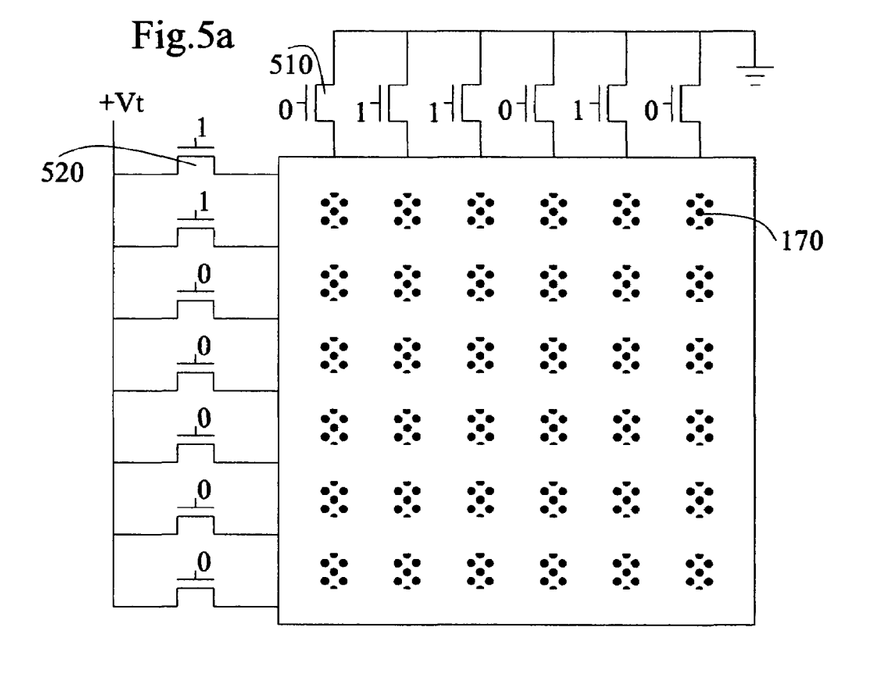
FIG. 5a and 5b illustrate an example of how data is input to the digital PEBLS.
Figure 5B:
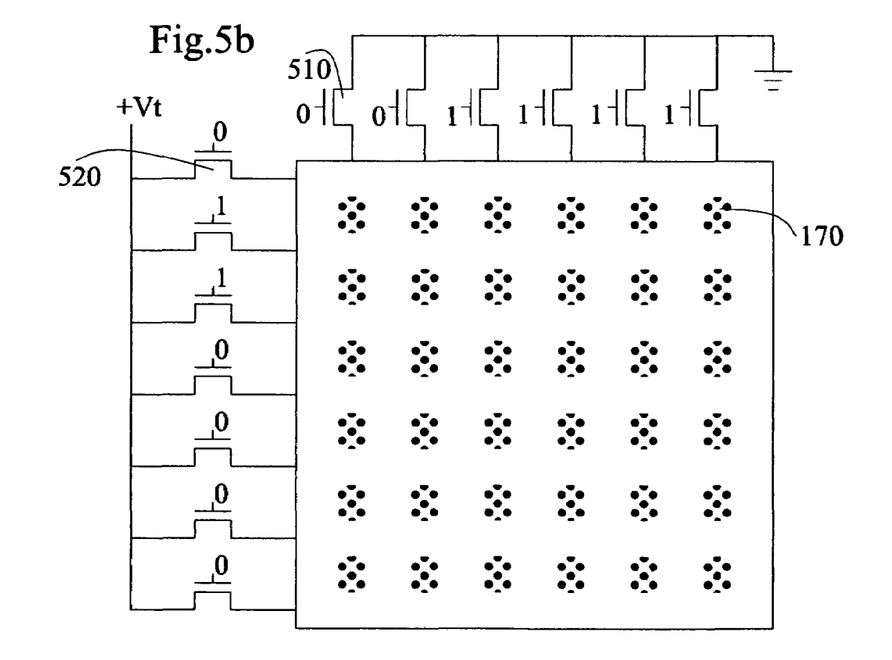

FIGS. 5a and 5b illustrate an example of how data is input to the digital PEBLS. Column control transistors 510 may be used to selectively connect the column wires 110 of the PEBLS to a ground connection. Row transistors 520 may be used to selectively connect row wires 150 to a positive turn-on voltage Vt. A desired raster bit pattern corresponding to desired actuation for the electron emission regions 170 may be stored in a ROM or other memory device and each row of the data may be used to actuate a particular row (or multiple rows) of the PEBLS. In FIG. 5a, the top row is selected by providing actuation voltages to the gates of the upper two row transistors. Data corresponding to the desired electron emission pattern for the first row (such as "011010" as shown) is used to select which of the column transistors 510 to actuate so as to generate field emission from the corresponding electron emission regions of the first row. In FIG. 5b, the second row is selected by providing actuation voltages to the gates of the second and third of the row transistors 520. Data corresponding to the desired electron emission pattern for the second row (such as "001111" as shown) is used to select which of the column transistors 510 to actuate so as to generate field emission from the corresponding electron emission regions of the second row. The third, fourth, and subsequent rows may be selected in a similar manner so as to produce a total field emission pattern corresponding to the input raster binary data. By providing a desired lithographic pattern data as the raster binary data the PEBLS may be used to transfer this pattern to a target undergoing lithography.

Figure 6A:
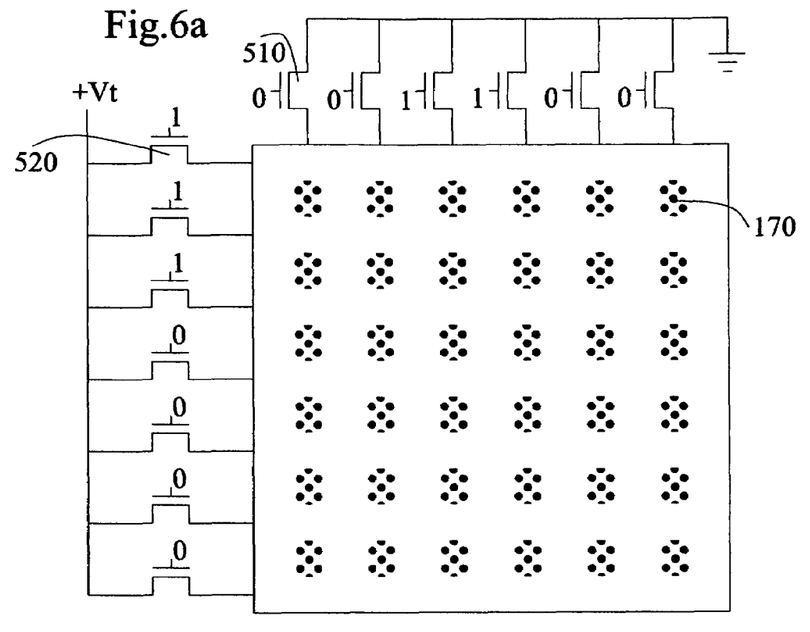
FIG. 6a and 6b illustrate two steps in an embodiment in which reduced resolution data is input to the PEBLS.
Figure 6B:
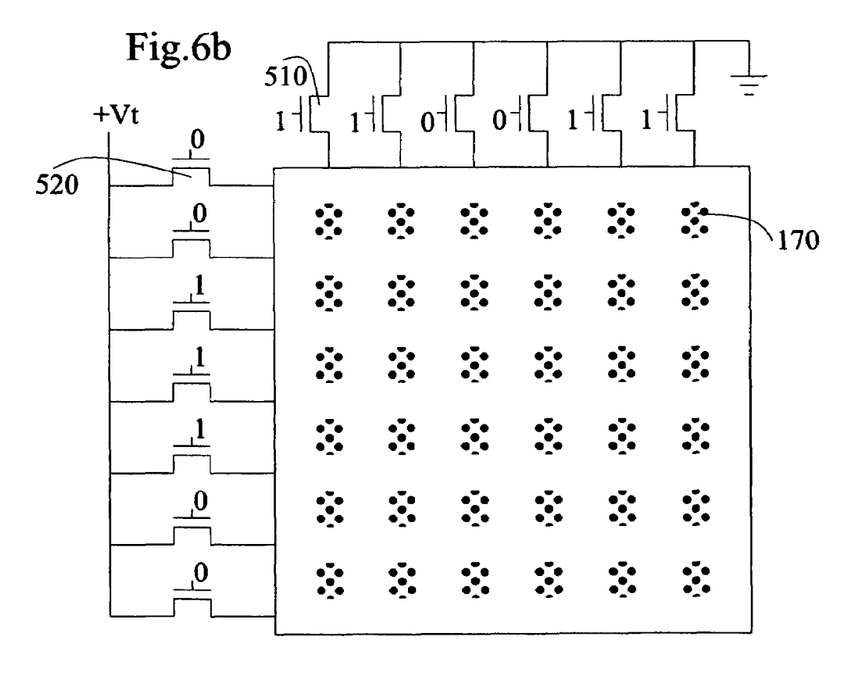

FIGS. 6a and 6b illustrate two steps in an embodiment in which reduced resolution data is input to the PEBLS. In this case three adjacent row transistors are addressed at one time so as to select two rows of the electron emission regions. The input row data is expanded such that binary bits $b_1 b_2 b_3$ becomes $b_1 b_1 b_2 b_2 b_3 b_3$. By provided reduced resolution control the advantage of higher speed processing may be achieved.

The control of the PEBLS as described in the above embodiments may be carried out by a control unit of a general purpose microprocessor or using specifically provided circuitry such as a shift register to advance the selection bits for the rows and a timer circuit to provide a clock signal used to synchronize the row selection with the input of the particular row data.

III. Relative Repositioning of PEBLS and Target and Beam Steering

In order to perform lithography over a complete area of a target substrate a relative repositioning of the PEBLS and the target substrate may be accomplished by mounting either the PEBLS or target substrate on an X-Y positioning stage. When the electron emission region 170 is representative of ¼ of the surface of the PEBLS complete coverage may be obtained with four relative positioning steps, however other techniques may be used to reduce or eliminate this repositioning. For example, the coverage area may be expanded by increasing the duration of field emission to allow charge build up and diffusion of the emitted electrons on the surface of, or within, the target substrate. Electron beam steering may also be employed to expand or contract (i.e. magnify or de-magnify) the coverage area of a particular electron emission region 170.

FIGS. 7a-7f illustrate various states of electron emission of the PEBLS responsive to actuation of adjacent conducting wire electrodes 150a, 150b when conductive wiring electrode layer 110 is set to a ground potential. The distance between electrode layer 110 and electrodes 150a, 150b may be of the same order as the distance between the surface of the PEBLS and the target substrate and may range in value from 1-100 microns. The threshold electric field necessary for field emission from high density nanotip arrays has been measured to be of the order of 1V/μm (see, for example, Suh et al. "Study of the field-screening effect of highly ordered carbon nanotube arrays, Applied Physics Letters, Vol. 80, No. 13, Apr. 2002 in which a field of 5.3 V/μm induced emission of nanotubes arranged at a $10^{10}/cm^2$ density). A sufficient positive voltage provided to the target substrate may be used to generate the majority of this field.

As an example, if a total separation between the grounded electrode 110 of the PEBLS and an anodic electrode of the target is of the order of a hundred microns the applied voltage for emission would be of the order of a few hundred volts. The actual applied voltage may be maintained at a value slightly below that necessary for field emission in order for the selectively actuated electrodes 150a and 150b to control the field emission. By appropriate calibration of the various parameters, the turn on voltage Vt of the selectively actuated electrodes may be of the order of 1-10 V which is a range suitable for the use of low power control and switching devices.

Figure 7A:
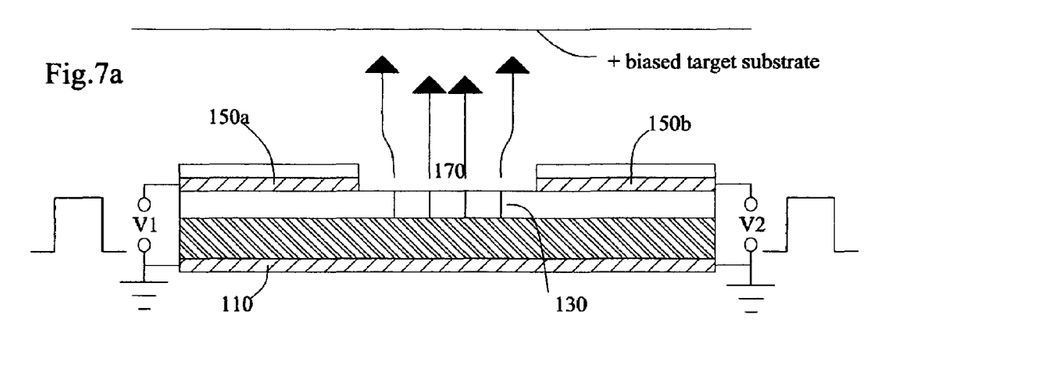
FIG. 7a-7f illustrate various states of electron emission of the PEBLS responsive to actuation of adjacent conducting wire electrodes.
Figure 7B:
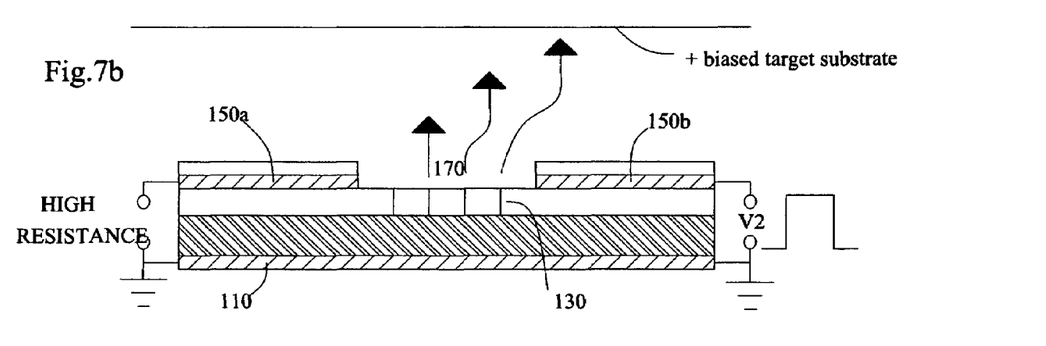
Figure 7C:
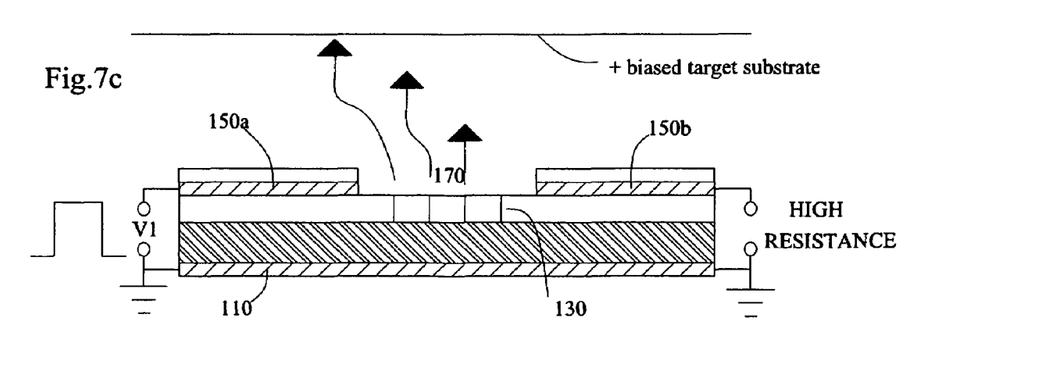

In FIG. 7a, a positive pulse width is used to as the turn on voltage Vt used to actuate both electrodes 150a and 150b sufficient to generate field emission. In FIG. 7b, the positive pulse is only applied to electrode 150b and electrode 150a is not actuated (i.e. is left at a high impedance state via the associated control transistor). In FIG. 7c, the positive pulse is only applied to electrode 50a and electrode 150b is not actuated. The arrows in FIG. 7a-7c are indicative of the electron path due to the alteration of the electrostatic field caused by the intermittent actuation of the electrodes 150a, 150b. Thus successive application of driving pulses to adjacent conducting wires (as explained in view of FIG. 5a-5b and FIG. 6a-6b) allows for e-beam coverage that is larger than the electron emission region 170.

Figure 7D:
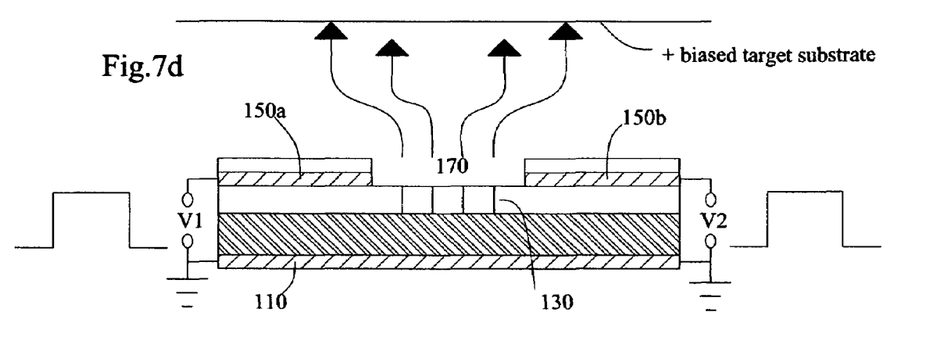
Figure 7E:
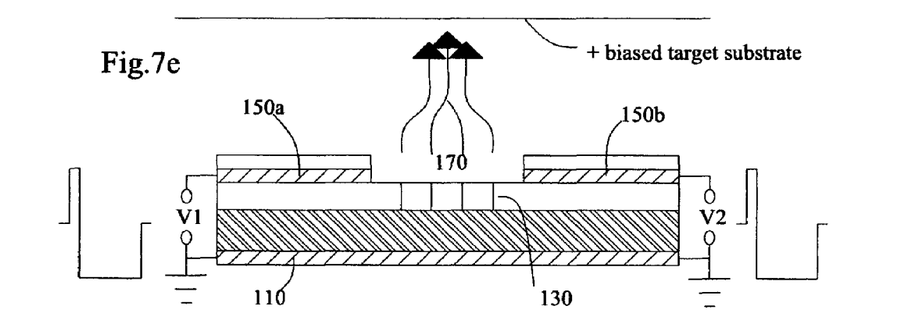
Figure 7F:
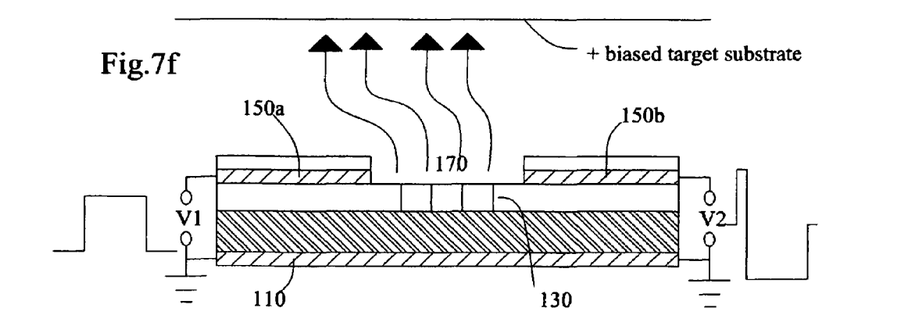

FIG. 7d illustrates the use of higher pulse width application to electrodes 150a and 150b. Since the electrodes are activated for a longer period of time electron emission occurs for a longer period and more electrons are emitted. Also the lateral deviation resulting from the positive bias of electrodes 150a and 150b is increased. This results in an expanded e-beam. FIG. 7e illustrates the use of a pulse waveform with two segments applied to electrodes 150a and 150b. The first segment provides the necessary positive voltage to allow for electron emission and the duration of this pulse determines the amount of electrons emitted. The second segment is of a negative polarity and may be used to focus the electrons that were emitted to a region that is smaller than the dimensions of the electron emission region 170. FIG. 7f illustrates the use of different applied waveforms to electrodes 150a and 150b which may be achieved by providing switching circuitry between each of the row transistors 520 and one of various Vt.

The techniques of FIG. 7d-7f may be used to facilitate magnification or de-magnification of the e-beam pattern and are thus useful for resolution control. It is noted that while this allows for resolution control in the direction perpendicular to the direction of parallel wires 150 it does not allow for resolution control in a direction parallel to wires 150. Therefore it may be advantageous to form wires 110 of a smaller width and spacing than wires 150 so as to have a finer maximum resolution in this direction. While the above examples illustrate the driving waveforms as rectangular waves it is noted that high voltage switching speeds may damage nanotips and trapazoidal driving waveforms with sloped voltage level transitions may be preferable.

IV. Multiple PEBLS

For high throughput applications multiple PEBLS may be provided either independently or on a common substrate. Shinjo et al. U.S. Pat. No. 5,412,641 gives some examples of independent control of 2D arrays of scanning probe tips which is applicable to the current invention.

Figure 8:
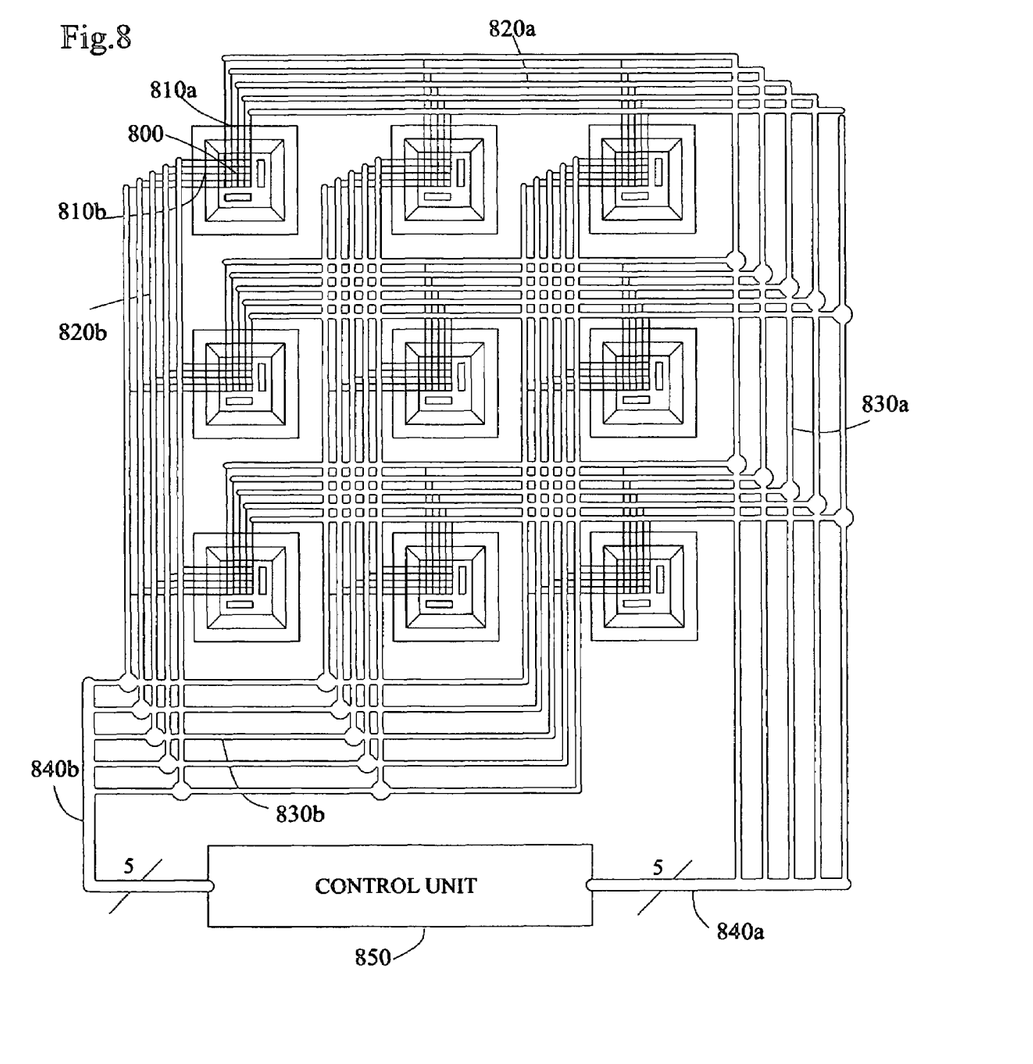
FIG. 8 illustrates an example of wiring pathways used to control multiple PEBLS.

FIG. 8 illustrates an example of wiring pathways used to control multiple PEBLS. Each of nine PEBLS 800 is connected to an array of five vertical wires 810a and five horizontal wires 810b. The signals delivered by wires 810a may be transmitted via connection wires 820a, 830a and bus 840a from a control unit 850 that may include the column and row control transistors 510, 520 or other control circuitry. The signals delivered by wires 810b may be transmitted via connection wires 820b, 830b and bus 840b from the control unit 850. The wires 810a-840a and 810b-840b may preferably be made of successively larger width (i.e. width of 840a>width of 830a>width of 820a>width of 810a). Amplification circuitry may be provided at the intersections between the different wiring sections to compensate for parasitic voltage drops due to different wiring resistances in different wiring paths. Alternatively, a fractal wiring pattern may be employed that makes the total wiring distance in each path equal.

Using the described wiring system multiple PEBLS may be controlled simultaneously to generate identical lithographic patterns on an opposing target substrate based on a desired two dimensional lithographic bit pattern. While FIG. 8 only shows control for nine 5 wire×5 wire PEBLS as an example similar wiring structures may be formed for a larger number of PEBLS with a larger number of input wires per PEBLS to achieve higher speed fabrication with higher resolution features.

V. Operation Methods

The digital PEBLS of the current invention may be employed in a variety of lithography methods depending on various factors including the characteristics of the target substrate (density, conductivity, etc.), the current density produced by the electron emission regions, the distance between the emission tips and the target substrate, and the concentration and pressure of the vapor/gaseous/liquid material introduced between the PEBLS and the target substrate. Following are some examples of such methods.

1. Electrostatic Assisted Patterning Using PEBLS.

The nanotips of the PEBLS may be used to establish an electrostatic pattern on an insulating substrate or thin film layer in accordance with a digital lithographic pattern. The fluid supply system of the PEBLS may then be used to supply a concentration of molecules or nanoparticles within the cavity of the PEBLS which may be attracted to the charged regions. Similar electrostatically driven nanofabrication techniques have been disclosed by Darty U.S. Pat. No. 6,899,854 and Deppert et al. U.S. Patent Application Publication 2003/0102444 and demonstrated by Mirkin et al. "Electrostatically Driven Dip-Pen Nanolithography of Conducting Polymers" (Adv. Mater., 2002, 14, No. 20) and Mesquida et al. "Maskless nanofabrication using the electrostatic attachment of gold particles to electrically patterned surfaces" (Microelectronic Engineering 61-62, 2002, 671-674).

2. Curing e-Beam Resists or Direct Etching Using PEBLS.

Conventional e-beam lithography may employ one of several possible negative or positive resists including COP, GeSe, PBS, or PMMA. These resists may also be used on a substrate to be processed by a PEBLS. Apart from the electron exposure step, the same steps of conventional electron lithography may be employed to initially coat the resist (such as by spin coating) and remove the exposed or unexposed resist patterns (depending on whether positive or negative resist is used) after electron beam exposure. However, the ability to locally supply or remove material via the fluidic channels provided in the PEBLS may help facilitate these steps of the fabrication procedure.

Etching may also be achieved by the PEBLS. Etching by tunneling or conventional electrons emitted from tips in proximity to a substrate are discussed in Li et al. U.S. Pat. No. 4,896,044 and Hodgson et al. U.S. Pat. No. 5,047,649. The same principles should apply to etching from a PEBLS with the improvement that PEBLS fabrication is a parallel rather than a serial process.

3. Electrochemical surface reactions using PEBLS.

Electrochemical lithographic processing may also be carried out by either coating the substrate to be processed with an electron sensitive film or properly controlling the atmosphere within the cavity of the PEBLS so as to contain a particular concentration of electron sensitive vapor. Bard et al. U.S. Pat. No. 4,968,390 provides an example of a scanning electrochemical tip used in this fashion. In another method, a target substrate may be coated with a removable sacrificial material followed by an electrochemically sensitive material or materials (such as an e-beam resist). Localized electrochemical bond making or breaking may then be performed on the electrochemically sensitive material or materials by the digital PEBLS according to a lithographic pattern. Applying a heat source to the target substrate and/or supplying a chemical etchant via one of the PEBLS fluid supply channels, the sacrificial material may then be removed from the target substrate and the lithographically patterned material may be flushed out by one of the microfluidic output channels formed in the PEBLS. Appropriate filtering may be used to isolate and collect the lithographically patterned structures provided that the size of the lithographic patterns is known and the pore size of the microfluidic filter used is designed to capture particles of this size. Thus the final products which may be generated using a PEBLS may exist in a form not only as part of a fabrication wafer, as traditionally achieved in silicon electronics, but in a solution form applicable to further chemical processing and with potential uses in pharmaceutical and chemical manufacture.

4. Example of Fabrication Using Additive Techniques.

Figure 9A:
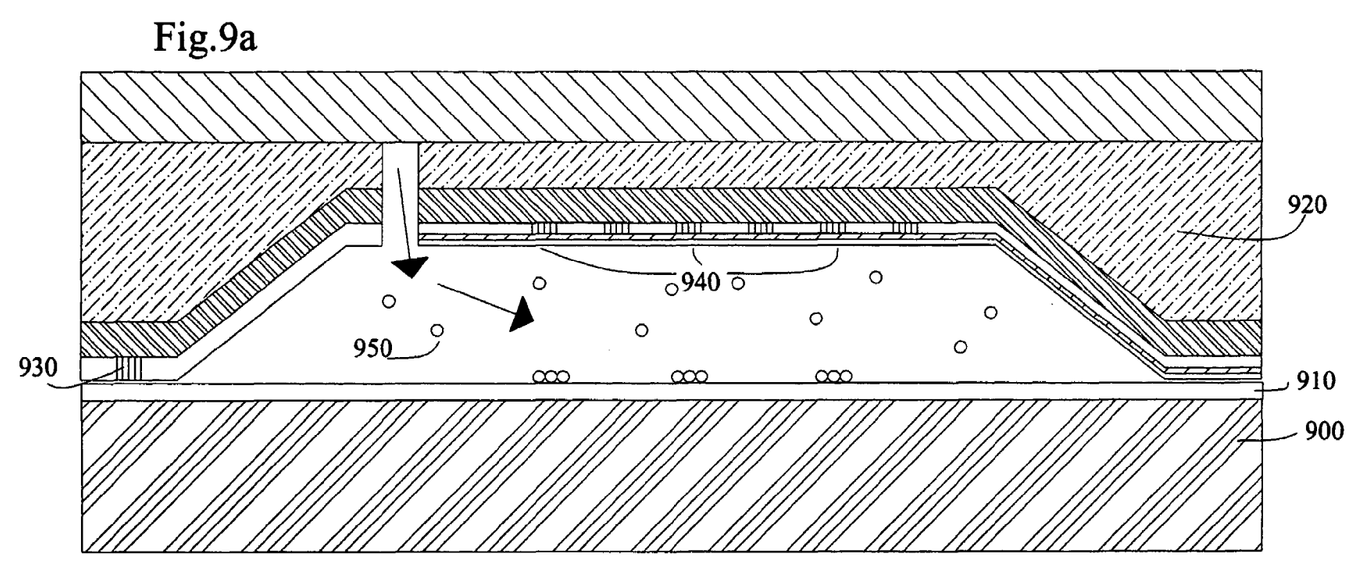
FIG. 9a-9c illustrate one possible fabrication procedure using the digital PEBLS.
Figure 9B:
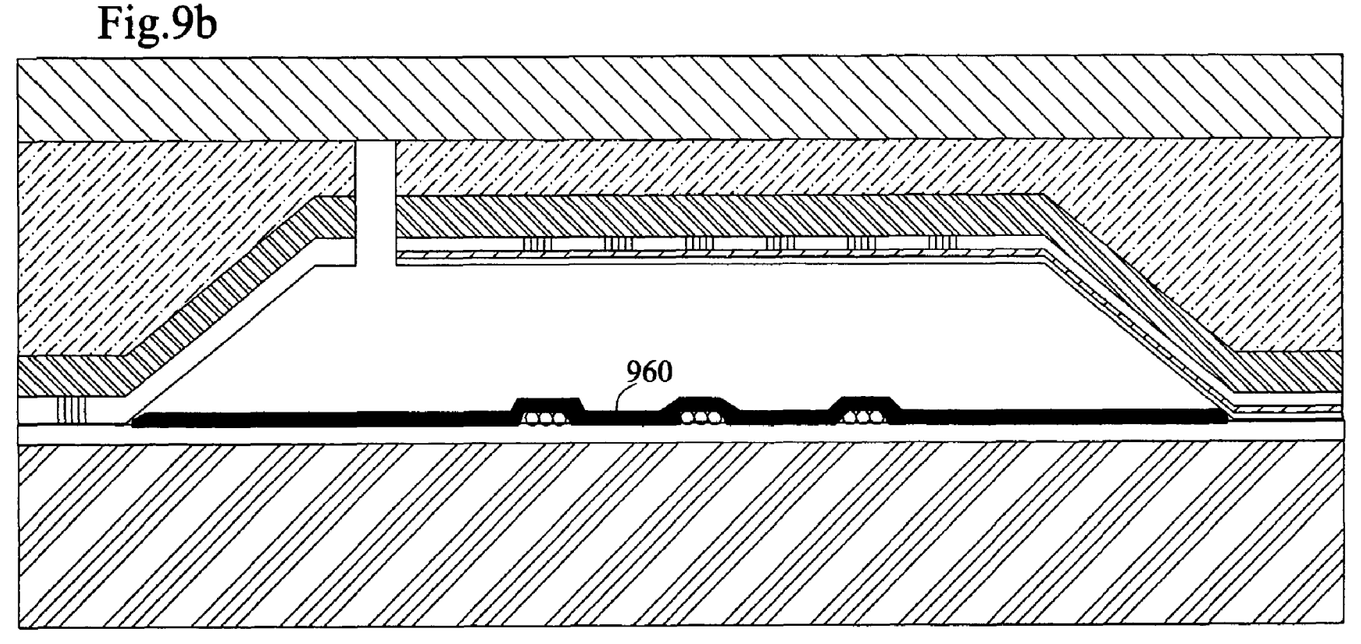
Figure 9C:
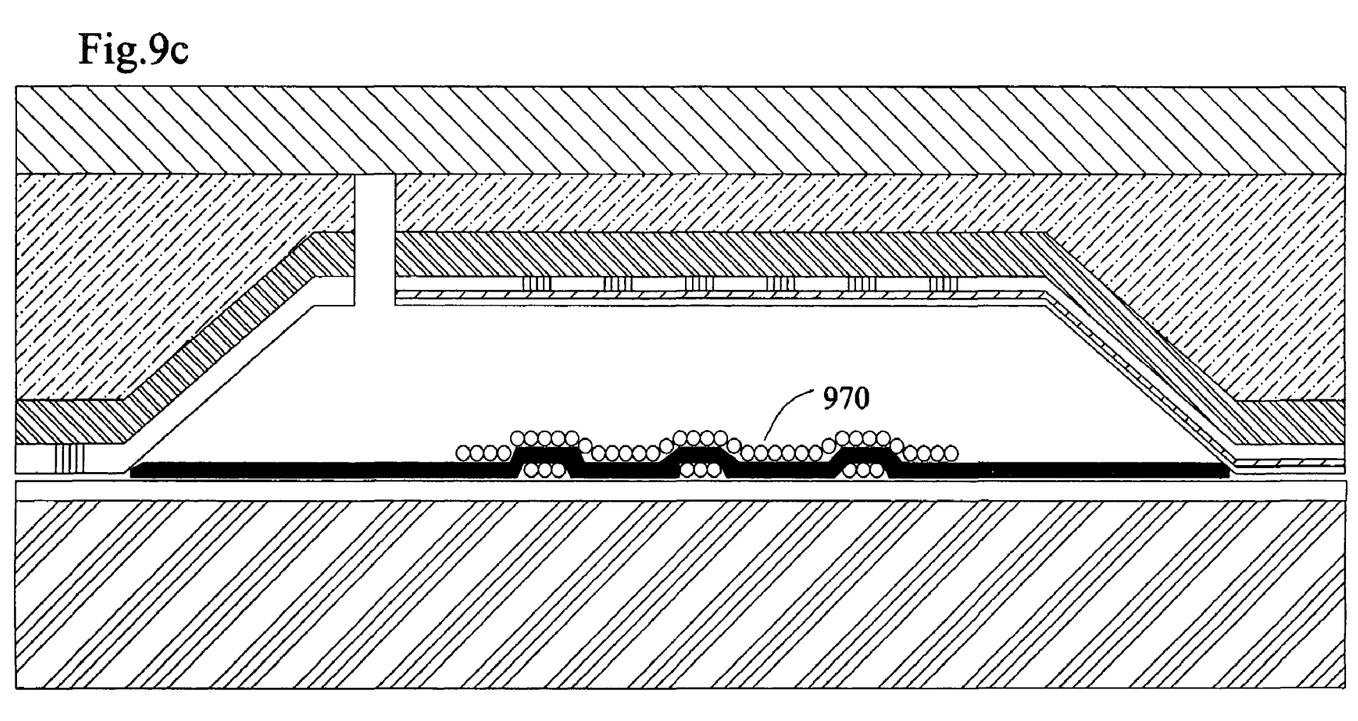

FIG. 9a-9c illustrate an example of fabricating a nanowire crossbar array using a PEBLS. Nanowire crossbars appear as a potentially valuable architecture to facilitate electronic devices with an increased density of functionality/size. The co-pending applications Ser. No. 11/395,232 "Crossbar Arithmetic Processor" and Ser. No. 11/395,237 "Programmable Crossbar Signal Processor" both filed Apr. 3, 2006 provide further guidance and background of applications for these structures.

In FIG. 9a, an insulated film 910 formed on a conducting or semiconducting substrate 900 is provided as a target substrate. The PEBLS 920 is aligned with the target substrate via alignment nanotips 930 and the space between the PEBLS and target substrate may be evacuated via one of the microfluidic flow channels of the PEBLS to establish a low pressure environment. Alternate columns of electron emission regions 940 are actuated to establish a corresponding electrostatic pattern on the target substrate. Via a microfluidic pumping technique a gaseous or liquid carrier medium containing conductive or semiconductive nanoparticles 950 is flowed past the surface of the target substrate at a flow rate sufficient to minimize attachment to the areas of the target substrate that are not charged.

In FIG. 9b, the enclosed space formed by the PEBLS and target substrate is filled with a molecular species 960 such as rotaxane or other material useful in molecular crossbar arrays.

In FIG. 9c, alternate rows of electron emission regions are actuated to establish a corresponding electrostatic pattern on a target substrate. Conductive or semiconductive nanoparticles 970 are flowed past the surface of the target substrate at a flow rate sufficient to minimize attachment to the areas of the target substrate that are not charged thus producing the upper conducting wires of the crossbar array. An insulating film material or molecular coating may then be provided over the crossbar array to protect the crossbar from damage.

Of course similar crossbar structures may be formed in alternative ways using the PEBLS tool using subtractive processing techniques such as etching or using e-beam resists and certain process steps may be performed by other fabrication tools or methods such as CVD, PVD, sputtering, ion implantation, etc.

VI. CONCLUSION

As described in the previous sections many modifications of the present invention are possible and many other applications within lithographic processing as well as obvious variations of the present invention are foreseeable. For example, while the crossing angle between the first and second sets of parallel wires used in the PEBLS is shown as ninety degrees, angles larger or smaller may be used. The electron emission area may range from values as small as 1 nm$^2$, using a single nanotube or nanowire as a field emission nanotip, up to values such as 100 μm$^2$, using hundreds of thousands of nanotubes per electron emission area, if the PEBLS is used in lithographic machining in which sub-micron precision is not necessary. The present invention is only limited by the following claims.

I claim:

1. A Digital Parallel Electron Beam Lithography Stamp (PEBLS) apparatus comprising:
   a substrate with a first side and a second side;
   a first array of parallel wires oriented in a first direction formed on the first side of the substrate;
   an array of lithographic nanotips capable of electron emission formed above the first wires and oriented substantially normal to the first side of the substrate;
   a second array of parallel wires formed above the array of lithographic nanotips and oriented in a second direction at an angle crossing with the first direction, wherein electron emission regions are formed between the wires in the array of second parallel wires;
   a control unit arranged to selectively address the electron emission regions in order to generate a lithographic pattern with the array of nanotips;
   a cell that forms an enclosing space on the first side of the substrate around the lithographic nanotips; and
   a target to which the lithographic pattern is transferred.

2. An apparatus of claim 1, wherein the lithographic nanotips are carbon nanotubes.

3. An apparatus of claim 1, wherein a periphery of the cell contacts the target.

4. An apparatus of claim 1, further comprising:
   at least one aperture formed through the substrate so as to allow fluid communication from the second side of the substrate to the enclosing space formed by the cell.

5. An apparatus of claim 1, further comprising:
   a positioning mechanism to provide alignment between the lithographic nanotips and the target.

6. An apparatus of claim 1, further comprising:
   a microfluidic flow control substrate capable of supplying and/or removing gas, vapor, or liquid material to a region enclosed by the PEBLS.

7. An apparatus of claim 1, wherein wires in the first array of parallel wires are formed to be of a smaller width and closer together than wires in the second array of parallel wires.

8. An apparatus of claim 1, wherein the control unit is arranged to provide a waveform to at least one wire of the first array of parallel wires or at least one wire of the second array of parallel wires so as to steer a generated electron beam.

9. A method of lithography comprising:
   providing the digital PEBLS apparatus as recited in claim 1; and
   using the digital PEBLS apparatus to perform at least one lithographic process step on the target.

10. A method of lithography of claim 9, wherein the at least one lithographic process step includes forming an electrostatic pattern on the target.

11. A method of lithography of claim 9, wherein the at least one lithographic process step includes curing an e-beam resist of the target.

12. A method of lithography of claim 9, wherein the at least one lithographic process step includes etching a pattern on the target.

13. A method of lithography of claim 9, wherein the at least one lithographic process step includes performing localized electrochemical reactions on the target.

14. A method of lithography of claim 9, wherein the at least one lithographic process step is used in manufacturing a crossbar structure.

15. A method of lithography of claim 9, wherein the at least one lithographic process step is used in the fabrication of an electronic circuit or electronic component.

16. A method of lithography of claim 9, wherein the at least one lithographic process step is used in the making or breaking of a chemical bond.

17. A method of lithography of claim 9, including a step of controlling the magnification or demagnification of a range of at least one of the electron emission regions.

18. A method of lithography of claim 9, including a step of controlling an electron beam direction emitted from at least one of the electron emission regions.

\* \* \* \* \*